(12) United States Patent
Wang

(10) Patent No.: US 12,477,707 B2
(45) Date of Patent: Nov. 18, 2025

(54) DISPLAY DEVICES

(71) Applicant: WUHAN CHINA STAR OPTOELECTRONICS SEMICONDUCTOR DISPLAY TECHNOLOGY CO., LTD., Hubei (CN)

(72) Inventor: Wenqiang Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/039,304

(22) PCT Filed: Mar. 23, 2023

(86) PCT No.: PCT/CN2023/083480
§ 371 (c)(1),
(2) Date: May 30, 2023

(87) PCT Pub. No.: WO2024/174320
PCT Pub. Date: Aug. 29, 2024

(65) Prior Publication Data
US 2024/0357779 A1    Oct. 24, 2024

(30) Foreign Application Priority Data
Feb. 21, 2023    (CN) .......................... 202310155216.4

(51) Int. Cl.
*H05K 7/20*    (2006.01)
(52) U.S. Cl.
CPC ....... *H05K 7/2099* (2013.01); *H05K 7/20309* (2013.01); *H05K 7/20327* (2013.01)

(58) Field of Classification Search
CPC ............ H05K 7/2099; H05K 7/20309; H05K 7/20327; H05K 7/20336
(Continued)

(56) References Cited

U.S. PATENT DOCUMENTS 1,329,559 A  *  2/1920  Tesla ......................... F15D 1/02
                                                137/842
2011/0149198 A1    6/2011  Kim et al.
(Continued)

FOREIGN PATENT DOCUMENTS

CN        102207763 A    10/2011
CN        109405605 A    3/2019
(Continued)

OTHER PUBLICATIONS

Zhang CN115151075 EPO translation (Year: 2022).*
(Continued)

*Primary Examiner* — Jayprakash N Gandhi
*Assistant Examiner* — Kyle Oxenknecht
(74) *Attorney, Agent, or Firm* — Wei Te Chung; PV IP PC

(57) ABSTRACT

A display device includes a display panel, a heating element located on a back side of a light-emitting surface of the display panel, and a support component located on the back side of the light-emitting surface of the display panel. The support component includes a loop heat dissipation cavity located inside the support component and a working fluid located in the loop heat dissipation chamber. A part of the loop heat dissipation cavity overlaps the heating element, and the loop type heat dissipation cavity includes at least one anti-backflow channel.

20 Claims, 6 Drawing Sheets

(58) Field of Classification Search
USPC .......................................................... 361/700
See application file for complete search history.

(56) References Cited

U.S. PATENT DOCUMENTS

2019/0274230 A1* 9/2019 North ................. H05K 7/20309
2022/0412291 A1* 12/2022 Song ......................... F23R 7/00

FOREIGN PATENT DOCUMENTS

| CN | 110769643 A | * | 2/2020 | ......... H05K 7/20309 |
| CN | 110796955 A |   | 2/2020 | |
| CN | 114630560 A | * | 6/2022 | ......... H05K 7/20327 |
| CN | 115151075 A | * | 10/2022 | ........... H05K 5/0217 |
| CN | 116096036 A |   | 5/2023 | |
| JP | 2000089682 A |   | 3/2000 | |

OTHER PUBLICATIONS

International Search Report in International application No. PCT/CN2023/083480,mailed on Jun. 3, 2023.
Written Opinion of the International Search Authority in International application No. PCT/CN2023/083480,mailed on Jun. 3, 2023.

* cited by examiner

DISPLAY DEVICES

CROSS REFERENCE TO RELATED APPLICATIONS

This application is a US national phase application based upon an International Application No. PCT/CN2023/083480, filed on Mar. 23, 2023, which claims priority to and the benefit of Chinese Patent Application No. 202310155216.4, filed on Feb. 21, 2023. The entire disclosures of the above application are incorporated herein by reference.

TECHNICAL FIELD

The present disclosure relates to a field of display technologies, and particularly relates to display devices.

BACKGROUND

When electronic devices such as mobile phones are running large-scale games, multi-interface operations, and multiple software in parallel, a heat emitting problem is more prominent, especially in a long-term high-temperature environment, which not only brings safety hazards to users, but also higher requirements for life and reliability of flexible displays and chips are put forward.

Therefore, how to improve a heat dissipation performance of the electronic devices is a technical problem that needs to be solved.

SUMMARY

Technical Problems

A purpose of the present disclosure is to provide a display device to reduce a thickness of the display device while improving a heat dissipation performance of the display device.

Technical Solutions

To achieve the above purpose, technical solutions provided by the present disclosure are as follows.

A display device includes:
a display panel;
a heating element located on a back side of a light-emitting surface of the display panel; and
a support component located on the back side of the light-emitting surface of the display panel, the support component includes:
a loop heat dissipation cavity located inside the support component, a part of the loop heat dissipation cavity overlapping the heating element, and the loop heat dissipation cavity including at least one anti-backflow channel; and
a working fluid located in the loop heat dissipation cavity.

Beneficial Effects

Owing to the fact that the loop heat dissipation cavity is located inside the support component, and a part of the loop heat dissipation cavity overlaps the heating element, while the support component plays a role in supporting the display panel, a working fluid in the loop heat dissipation cavity of the support component also plays a heat dissipation role in the heat generated by the heating element through phase change, that is, the support component integrates both a support function and a heat dissipation function. The problem that providing additional independent heat dissipation component may cause a too thick thickness of the display device is got improved, while reducing the risk of black spots and bright lines on the screen caused by local high temperatures in the display device. Moreover, the loop heat dissipation cavity includes at least one anti backflow channel, which is conducive to a unidirectional flow of the working fluid, thereby improving the circuit crosstalk problem during the heat dissipation process and greatly improving the heat dissipation efficiency of the working fluid working in the loop heat dissipation cavity.

The accompanying drawings are marked as follows:
100, display panel; 200, display module; FA, folding area; NFA, non-folding area;
10, display panel; 10a, light emitting surface;
11, heating element;
12, support component; 121, rigid support member; 121a, opening; 1211, support body; 1211a, loop heat dissipation groove; 1211b, installation groove; 1212, cover plate; 122, buffer layer; 123, back plate;
13, middle frame; 131, first part; 132, second part;
14, loop heat dissipation cavity; 141, liquid storage chamber; 141a, first inlet; 141b, a first outlet; 142, evaporation chamber; 142a, second inlet; 142b, a second outlet; 143, evaporation channel; 144, anti-backflow channel; 144a, anti-backflow inlet; 144b, anti-backflow outlet; 1441, main flow channel; 1442, anti-backflow sub-channel; 1442a, inlet sub-channel; 1442b, outlet sub-channel; 1442c, intermediate channel;
145, vapor accommodating chamber; 145a, third inlet; 145b, third outlet; 146, condensation chamber; 146a, fourth inlet; 146b, fourth outlet;
151, first adhesive layer; 152, second adhesive layer; 153, third adhesive layer; 154, fourth adhesive layer; 155, fifth adhesive layer; 156, sixth adhesive layer;
F, working fluid; 16, thermal pad; 18. isolation part; 19, partition part; 20, polarizer; 21, ultra-thin glass; 22, protective window.

DETAILED DESCRIPTION OF EMBODIMENTS

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

Figure 1:
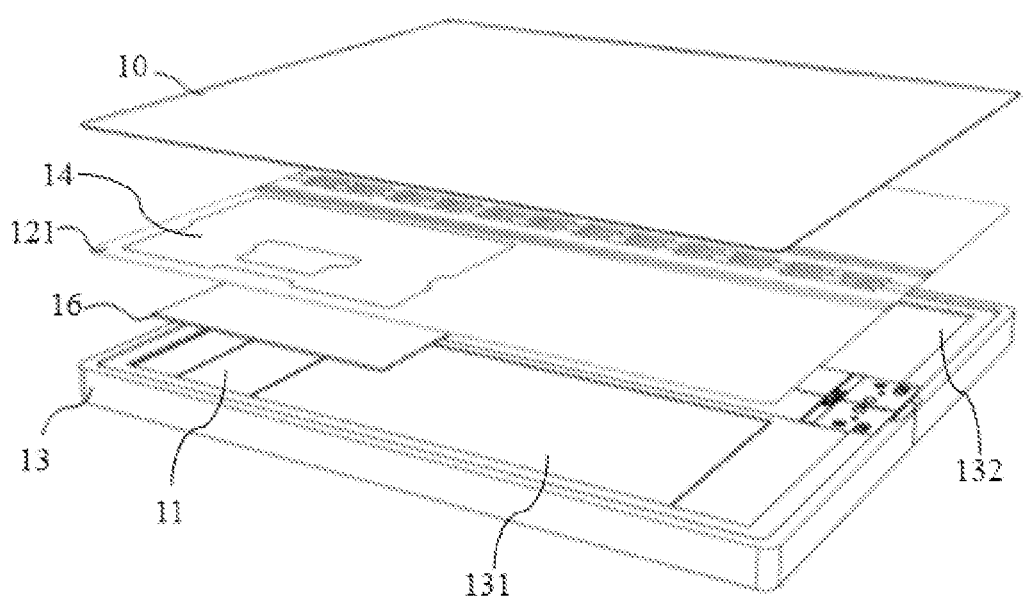
FIG. 1 is a schematic view of a middle frame, a heating element, a thermal pad, and a display panel of a display device provided by an embodiment of the present disclosure.
Figure 2:
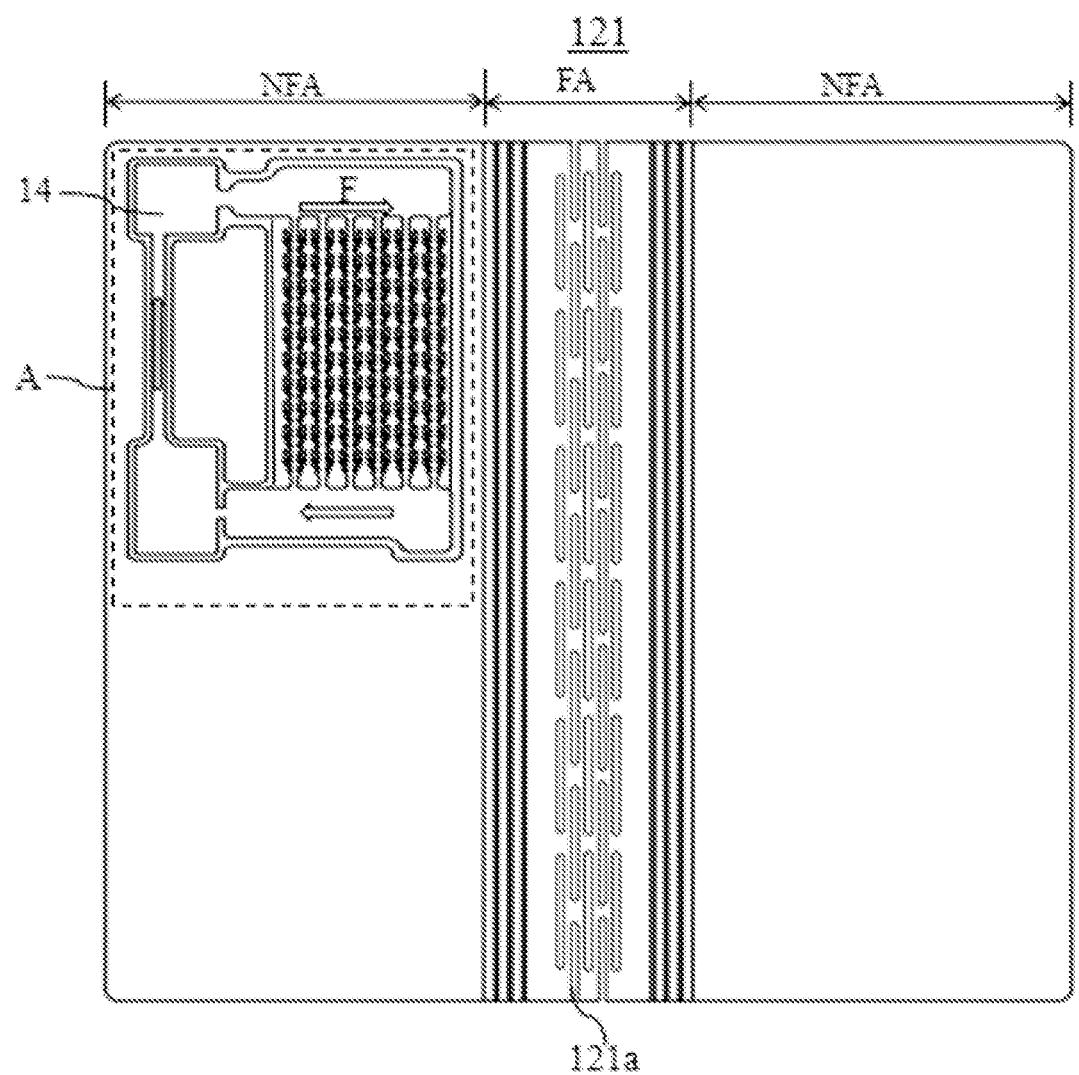
FIG. 2 is a plan schematic view of a rigid support member in an unfolded state provided by an embodiment of the present disclosure.
Figure 3:
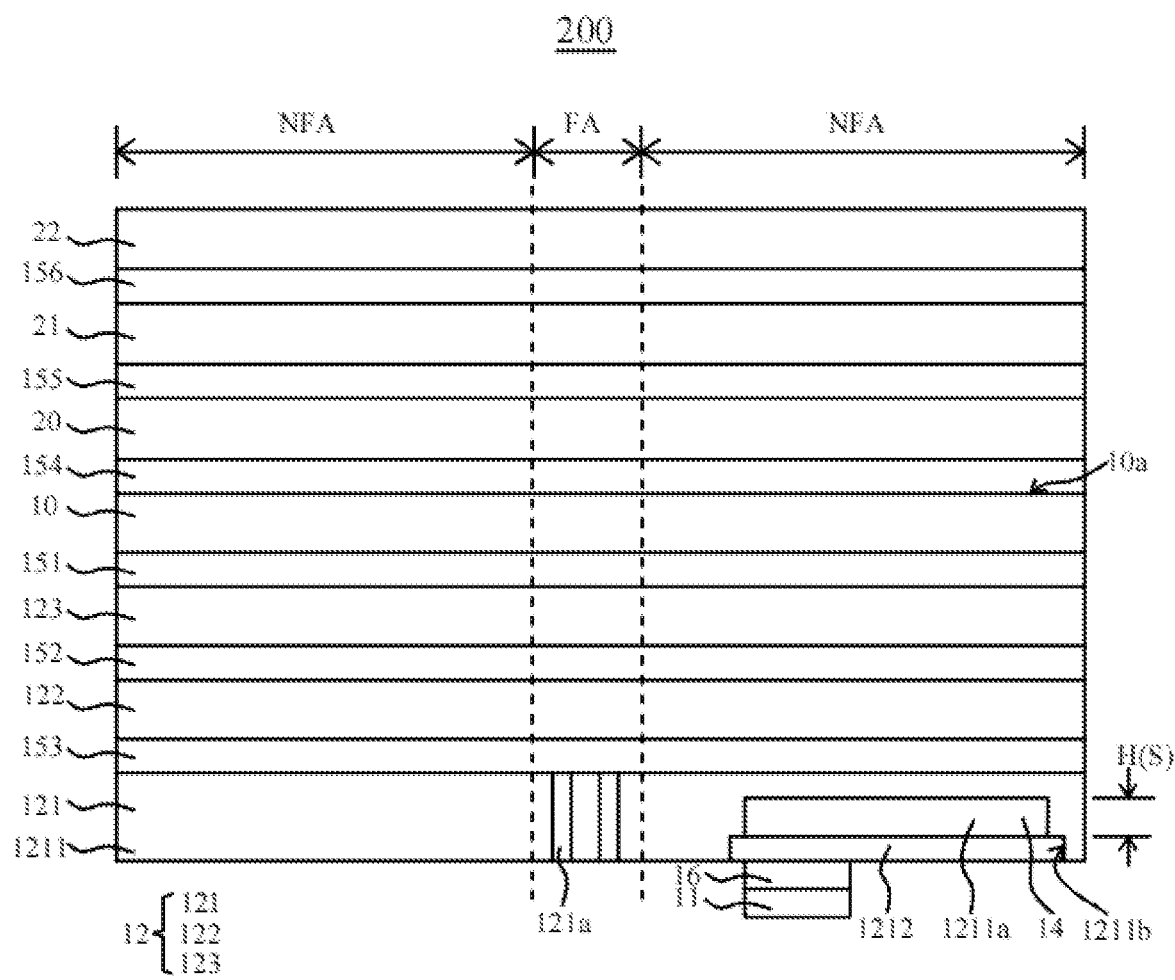
FIG. 3 is a first cross-sectional schematic view of the display device provided by an embodiment of the present disclosure.
Figure 4:
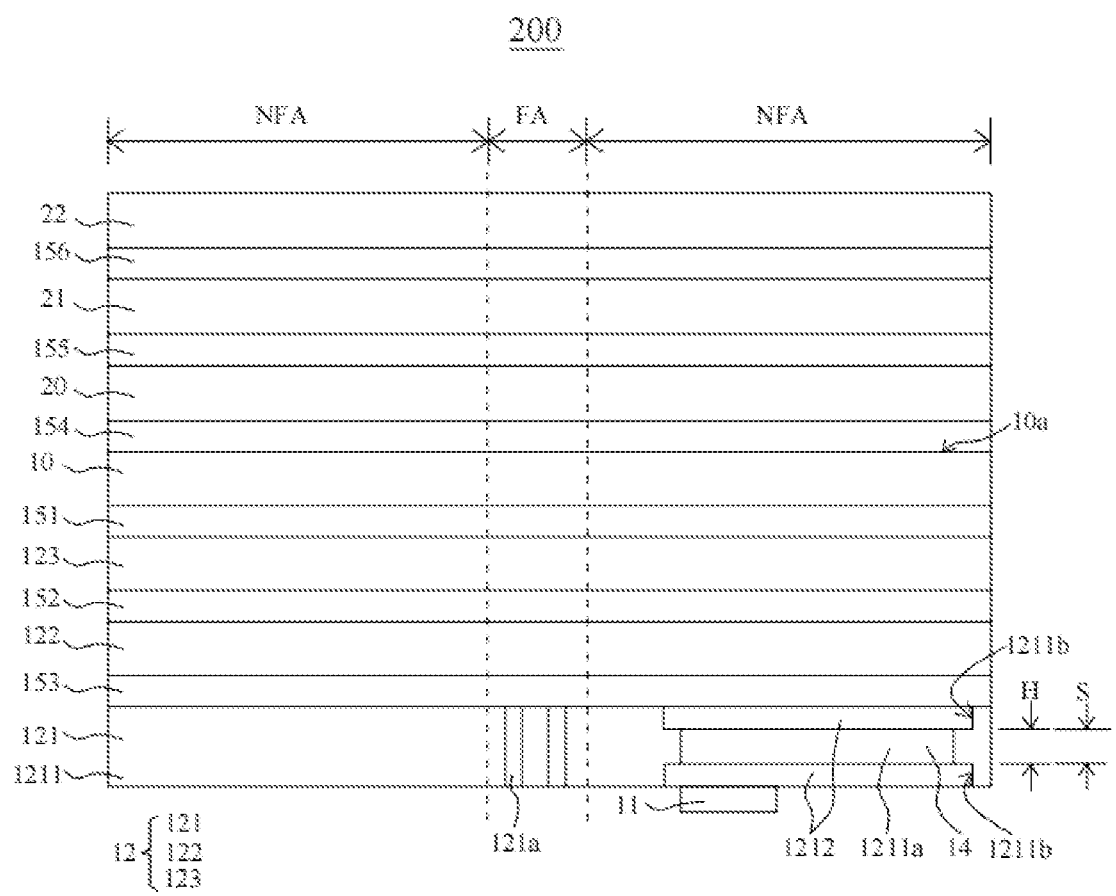
FIG. 4 is a second cross-sectional schematic view of the display device provided by an embodiment of the present disclosure.
Figure 5:
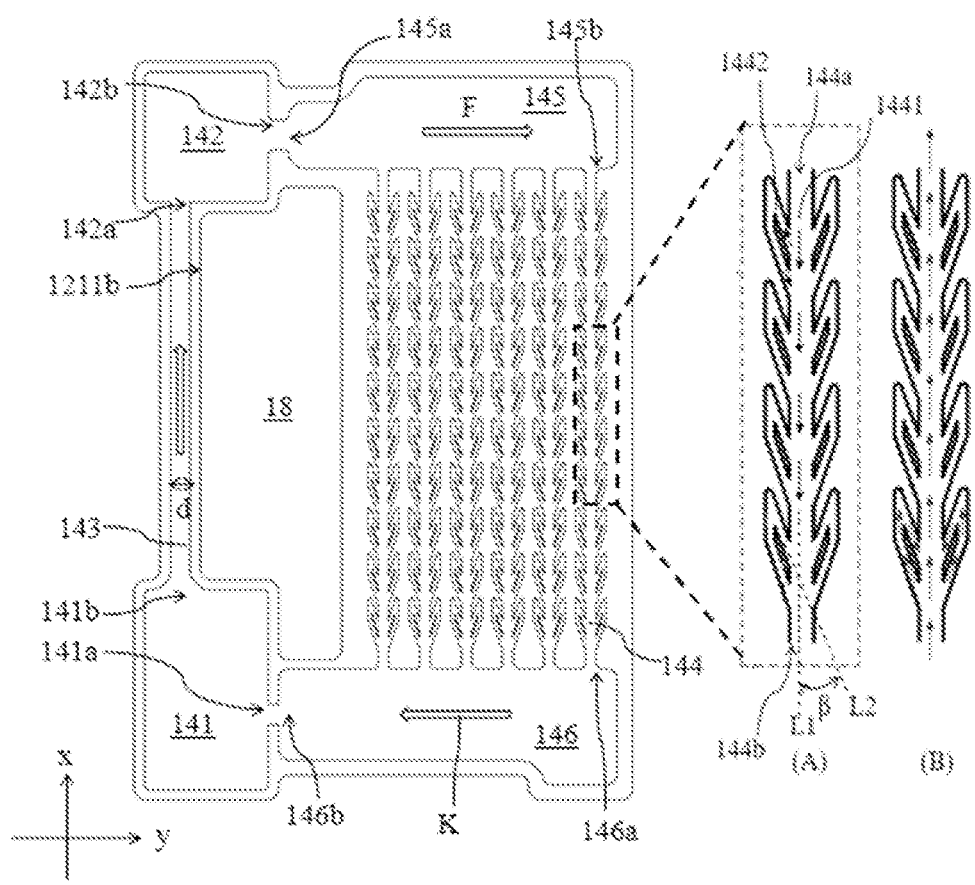
FIG. 5 is a partially enlarged schematic view at a position A in FIG. 2.
Figure 6:
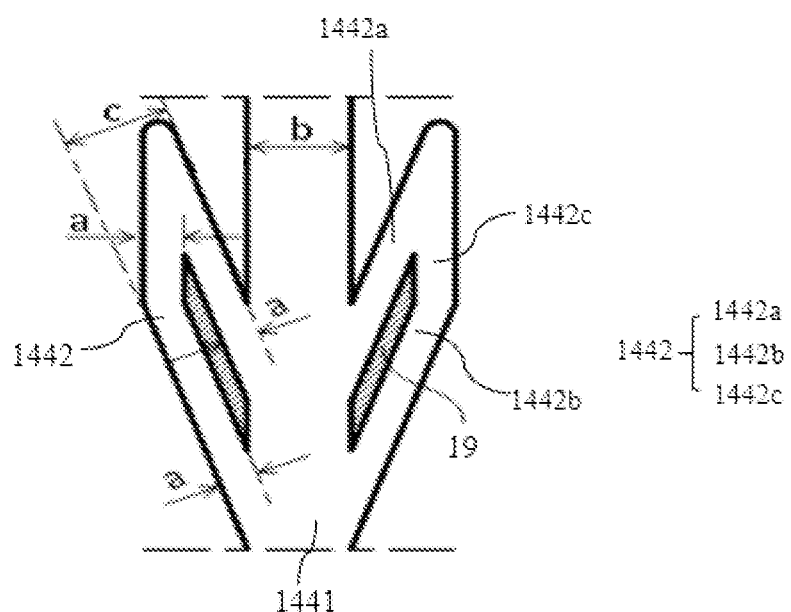
FIG. 6 is a partially enlarged schematic view of anti-backflow channels and partition parts of the rigid support member in FIG. 5.

Referring to FIGS. 1 to 6, FIG. 1 is a schematic view of a middle frame, a heating element, a thermal pad, and a display panel of a display device provided by an embodiment of the present disclosure. FIG. 2 is a plan schematic view of a rigid support member in an unfolded state provided by an embodiment of the present disclosure. FIG. 3 is a first cross-sectional schematic view of the display device provided by an embodiment of the present disclosure. FIG. 4 is a second cross-sectional schematic view of the display device provided by an embodiment of the present disclosure. FIG. 5 is a partially enlarged schematic view at a position A in FIG. 2. FIG. 6 is a partially enlarged schematic view of anti-backflow channels and partition parts of the rigid support member in FIG. 5.

A display device 100 is provided by the present disclosure. The display device 100 may be a foldable display device. The display device 100 includes a display module 200 and a middle frame 13.

In the embodiment, the display module 200 includes a folding area FA and two non-folding areas NFA adjacent to the folding area FA, and the two non-folding areas NFA are located at opposite sides of the folding area FA.

It can be understood that the display device 100 may is a non-foldable display device, and the display module 200 does not include the folding area FA.

In the embodiment, referring to FIG. 1, the middle frame 13 includes a first part 131 and a second part 132, and the first part 131 and the second part 132 are connected by hinge rotation. Parts of the display module 200 corresponding to the two non-folding areas NFA are respectively located on the first part 131 and the second part 132, and a part of the display module 200 corresponding to the folding area FA are disposed on a hinge.

In the embodiment, the display module 200 includes a display panel 10, a support component 12, and a heating element 11.

In the embodiment, the display panel 10 is a flexible display panel with a light emitting surface 10a. Specifically, the flexible display panel include but are not limited to a flexible organic light-emitting diode display panel.

It can be understood that when the display device 100 is a non-foldable display device, the display panel 10 may include but not limited to at least one of a liquid crystal display panel, a quantum dot light-emitting display panel, a micro light-emitting diode display panel, and a mini light-emitting diode display panel.

In the embodiment, the heating element 11 is located on a back side of a light emitting surface 10a of the display panel 10. The heating element 11 is located on at least one of the first part 131 and second part 132 of the middle frame 13, and/or the heating element 11 is located on the hinge.

Specifically, the heating element 11 is located on the middle frame 13, and the heating element 11 is located on a side of the support component 12 away from the display panel 10.

In the embodiment, the heating element 11 is located in at least one non-folding area NFA. Specifically, the heating element 11 is located in a non-folding area NFA. It can be understood that when a number of the heating elements 11 is multiple, the heating elements 11 may be located in two non-folding areas NFA. In addition, the heating element 11 may be disposed in the folding area FA.

In the embodiment, the heating element 11 includes but is not limited to at least one of an integrated circuit and a battery. The integrated circuit includes at least one of a chip and a main circuit board.

It should be noted that the heating element 11 may generates a large amount of heat during working, resulting in a higher temperature of heating element 11. If the heat generated by the heating element 11 is not properly evacuated, the heat may affect the working performance and service life of the heating element 11. At the same time, the heat diffusion to display panel 10 may also have an adverse impact on the working performance of the display panel 10.

In the embodiment, to improve the heating problem of the heating element 11, the support component 12 is located on the back side of the light emitting surface 10a of the display panel 10, and the support component 12 includes a loop heat dissipation cavity 14 and a working fluid F. The loop heat dissipation cavity 14 is located inside the support component 12, and a part of the loop heat dissipation cavity 14 overlaps with the heating element 11. The working fluid F is located in the loop heat dissipation cavity 14.

On the one hand, the support component 12 is located on a back side of the display panel 10 to support the display panel 10. On the other hand, when the heat emitted by the heating element 11 diffuses to the support component 12, due to the characteristics of the working fluid F itself, the working fluid F absorbs the heat emitted by the heating element 11 in the loop type heat dissipation cavity 14 of the support component 12, and then releases the heat, generating phase change and flow, which may help to transfer heat and dissipate it to the outside world. That is, a part of the support component 12 provided with the loop type heat dissipation cavity 14 may play a heat dissipation role. Therefore, the support component 12 integrates both support and heat dissipation functions.

Compared to some related technologies where independent heat dissipation components are installed outside the support component 12, which results in the heat dissipation component occupying additional space, the present disclosure integrates the loop type heat dissipation cavity 14 into an interior of the support component 12, and the working fluid F is disposed in the loop type heat dissipation cavity 14, which is more conducive to saving space, reducing a overall thickness of the display device, and reducing a weight of the display device. Realizing a reduction of components and improving integration is beneficial for an overall lightweight design of the display device, as well as improving the risk of black spots and bright lines on the screen caused by local high temperatures.

In the embodiment, the working fluid F includes two states: liquid and gaseous. The liquid working fluid F absorbs heat and becomes gaseous, and the gaseous working fluid F releases heat and condenses into liquid.

A specific heat capacity C of the working fluid F is greater than 4000 J/(kg·° C.), which makes the working fluid F have a high specific heat capacity. Therefore, the working fluid F may absorb a lot of heat while keeping a temperature inside the loop type heat dissipation cavity 14 from being too high.

The working fluid F includes at least one of ethylene glycol, propylene glycol, and fluorinated liquid.

In the embodiment, the support component 12 includes a rigid support member 121, a buffer layer 122 and a back plate 123.

It can be understood that in other embodiments, the support component 12 may only include one or two of the rigid support member 121, the buffer layer 122, and the back plate 123.

In the embodiment, the back plate 123 not only supports the display panel 10, but also protects a back of the display panel 10. The back plate 123 is located in the folding area FA and the two non-folding areas NFA, and is bonded to a back side of the display panel 10 through a first adhesive layer 151.

In the embodiment, a thickness of the back plate 123 is greater than or equal to 50 microns and less than or equal to 120 microns. For example, the thickness of the back plate 123 is 50 microns, 60 microns, 70 microns, 80 microns, 100 microns, or 120 microns.

In the embodiment, materials of the back plate 123 includes an organic material, which includes but is not limited to at least one of polyimide and polyethylene terephthalate. It can be understood that the back plate 123 may include metal materials, including but not limited to at least one of copper, iron, and aluminum. Alternatively, the back plate 123 may include glass.

In the embodiment, the buffer layer 122 not only supports the display panel 10, but also plays a role in resisting impact to protect the display panel 10. The buffer layer 122 is located in the folding area FA and the two non-folding areas NFA. A thickness of the buffer layer 122 in the folding area FA is equal to a thickness of the buffer layer 122 in the two non-folding areas NFA. The buffer layer 122 is bonded to a back side of the back plate 123 away from the display panel 10 through a second adhesive layer 152.

It can be understood that in other embodiments, the buffer layer 122 may be located only in the two non-folding areas NFA, rather than in the folding area FA. Alternatively, the thickness of the buffer layer 122 in the folding area FA is smaller than the thickness of the buffer layer 122 in the two non-folding areas NFA.

In the embodiment, the thickness of the buffer layer 122 is greater than or equal to 50 microns and less than or equal to 200 microns. For example, the thickness of the buffer layer 122 is 50 microns, 60 microns, 70 microns, 80 microns, 100 microns, 120 microns, 130 microns, 140 microns, 150 microns, 160 microns, 170 microns, 180 microns, 190 microns, or 200 microns.

In the embodiment, materials of the buffer layer 122 includes a foam, and the foam includes holes.

In the embodiment, the rigid support member 121 plays a supporting role on the display panel 10. At least a part of the rigid support member 121 is located in the two non-folding areas NFA, and the rigid support member 121 is bonded to a surface of the buffer layer 122 away from the back plate 123 through a third adhesive layer 153. The material of the rigid support member 121 includes metals, which includes but is not limited to steel.

Specifically, the rigid support member 121 is located in the two non-folding areas NFA and the folding area FA. A part of the rigid support member 121 corresponding to the folding area FA is provided with an opening 121a, which runs through the rigid support member 121 along a thickness direction of the rigid support member 121 to improve the bending performance of the rigid support member 121 corresponding to a part of the folding area FA while ensuring the support performance of a part of the rigid support member 121 corresponding to the non-folding area NFA.

In the embodiment, a thickness of the rigid support member 121 is greater than or equal to 20 microns and less than or equal to 50 microns. For example, the thickness of the rigid support member 121 is 20 microns, 25 microns, 30 microns, 35 microns, 40 microns, 45 microns, or 50 microns.

In the embodiment, the loop type heat dissipation cavity 14 is located inside the rigid support member 121 to enable the rigid support member 121 closest to the heating element 11 in the support component 12 to dissipate heat emitted by the heating element 11 more quickly. In addition, the rigid support member 121 is prepared by a metal material, the metal has better thermal conductivity and heat resistance, and the metal has better barrier and corrosion resistance to the working fluid F, which is beneficial for improving the heat dissipation capacity of the rigid support member 121 and improving its service life.

It can be understood that the loop heat dissipation cavity 14 may be located inside at least one of the buffer layer 122 and the back plate 123. Especially, when the support component 12 does not include a rigid support member 121, the loop heat dissipation cavity 14 may be disposed inside the buffer layer 122. Alternatively, when the support component 12 does not include a buffer layer 122 and a rigid support member 121, the loop heat dissipation cavity 14 may be disposed inside the back plate 123.

In the embodiment, the loop heat dissipation cavity 14 is a hollow and sealed space. In a thickness direction of the display device 100, a height H of the loop heat dissipation cavity 14 is greater than or equal to 10 microns and less than or equal to 30 microns. For example, in the thickness direction of the display device 100, the height H of the loop heat dissipation cavity 14 is 10 microns, 12 microns, 14 microns, 16 microns, 18 microns, 20 microns, 22 microns, 24 microns, 26 microns, 28 microns, or 30 microns.

The loop heat dissipation cavity 14 is located in the non-folding area NFA to accommodate the heating element 11 located in the non-folding area NFA.

In the embodiment, the rigid support member 121 includes a support body 1211 and at least one cover plate 1212.

In the embodiment, the support body 1211 is located in the two non-folding areas NFA and in the folding area FA. A part of the support body 1211 corresponding to the folding area FA includes one or more openings 121a, and a part of the support body 1211 corresponding to the non-folding area NFA is provided with a loop heat dissipation groove 1211a. A material of the support body 1211 includes steel.

It should be noted that the loop heat dissipation groove 1211a is formed by at least one of chemical etching and laser engraving methods, and is obtained by excavating the support body 1211. After forming the loop heat dissipation groove 1211a, seal the loop heat dissipation groove 1211a with at least one cover plate 1212 by friction stir welding or mechanical structural adhesive to form the loop type heat dissipation cavity 14.

In the embodiment, at least one covering plate 1212 covers the circuit heat dissipation groove 1211a and seals the circuit heat dissipation groove 1211a to form a sealed circuit heat dissipation cavity 14. The loop heat dissipation cavity 14 is jointly defined by an inner wall of the loop heat dissipation groove 1211a and a surface of at least one covering plate 1212 covering the loop heat dissipation groove 1211a.

In the embodiment, referring to FIG. 3, a depth S of the loop heat dissipation groove 1211a is less than a thickness of the support body 1211. The loop heat dissipation groove 1211a is defined on a surface of the support body 1211 away from the display panel 10, and the covering plate 1212 is located in the side of the loop heat dissipation groove 1211a away from the display panel 10, which is conducive to the loop heat dissipation cavity 14 being closer to the heating element 11, It is beneficial for the rigid support member 121 to dissipate heat from the heating element 11 faster. In addition, a surface of the support body 1211 that overlaps with the loop heat dissipation groove 1211a and is close to the display panel 10 may provide better support for the display panel 10.

It can be understood that in other embodiments, the loop heat dissipation groove 1211a may be defined on a surface of the support body 1211 close to the display panel 10, the cover plate 1212 covers the loop heat dissipation groove 1211a, and the cover plate 1212 is located between the loop heat dissipation groove 1211a and the display panel 10.

In the embodiment, a depth S of the loop heat dissipation groove 1211a is greater than or equal to 10 microns and less than or equal to 30 microns. For example, the depth S of the loop heat dissipation groove 1211a is 10 microns, 12 microns, 16 microns, 18 microns, 20 microns, 22 microns, 24 microns, 26 microns, 28 microns, or 30 microns.

In another embodiment, referring to FIG. 4, two cover plates 1212 are disposed relative and spaced in a thickness direction of the support body 1211. The two cover plates 1212 are located on opposite sides of the loop heat dissipation groove 1211a and cover the loop heat dissipation groove 1211a. An inner wall of the loop heat dissipation groove 1211a and surfaces of the two cover plates 1212 covering the loop heat dissipation groove 1211a are enclosed to form the loop heat dissipation cavity 14.

In the embodiment, referring to FIGS. 3 to 5, the support body 1211 further includes an installation groove 1211b, which is located on at least one side of the loop heat dissipation groove 1211a in the thickness direction of the support body 1211. The installation groove 1211b covers the loop heat dissipation groove 1211a and is connected to the loop heat dissipation groove 1211a. The cover plate 1212 is installed in the installation groove 1211b and seals the loop heat dissipation groove 1211a to form the loop heat dissipation cavity 14.

In the embodiment, referring to FIG. 3, an installation groove 1211b is located on the side of the loop heat dissipation groove 1211a away from the display panel 10 in the thickness direction of the support body 1211.

In another embodiment, referring to FIG. 4, two installation grooves 1211b are located on opposite sides of the loop heat dissipation groove 1211a in the thickness direction of the support body 1211.

In the embodiment, when the display device 100 is in an unfolded state, a surface of the cover plate 1212 located in the installation groove 1211b away from the loop heat dissipation cavity 14 is flush with a surface of the support body 1211, to ensure that the display module 200 has a good appearance in the unfolded state.

It can be understood that when the display device 100 is in the unfolded state, the surface of the cover plate 1212 located in the installation groove 1211b away from the loop heat dissipation cavity 14 may protrude from the surface of the support body 1211, or the surface of the support body 1211 may protrude from the surface of the cover plate 1212 away from the loop heat dissipation cavity 14.

In the embodiment, a material of the cover plate 1212 is the same as that of the rigid support member 121. The material of cover plate 1212 includes metal, for example, the material of cover plate 1212 includes steel. It can be understood that the material of the cover plate 1212 may be different from the material of the rigid support member 121.

In another embodiment, a thermal conductivity of the material of the cover plate 1212 is greater than that of the material of the rigid support member 121, in order to improve the thermal conductivity of the cover plate 1212, which is beneficial for cover plate 1212 to facilitate the faster transfer of heat from the heating element 11. For example, the materials of the cover plate 1212 include materials such as copper or graphene.

In the embodiment, referring to FIG. 3, the display device 100 further includes a thermal pad 16, which is located between the cover plate 1212 and the heating element 11. The thermal pad 16 is in contact with the heating element 11 and the cover plate 1212, that is, the heat emitted by the heating element 11 is transmitted to the cover plate 1212 through the thermal pad 16. The material of the thermal pad 16 includes but is not limited to organic silicon.

In other embodiments, referring to FIG. 4, the cover plate 1212 close to the heating element 11 is in contact with the heating element 11, meaning that the heating element 11 directly transfers heat to the cover plate 1212.

In the embodiment, referring to FIG. 5, the loop heat dissipation cavity 14 includes a liquid storage chamber 141, an evaporation chamber 142, an evaporation channel 143, and at least one anti-backflow channel 144.

In the embodiment, the liquid storage chamber 141 is used to store the working fluid F in a liquid state. The liquid storage chamber 141 is located inside the rigid support member 121, and the liquid storage chamber 141 includes a first inlet 141a and a first outlet 141b.

In the embodiment, the evaporation chamber 142 is used to absorb the heat emitted by the heating element 11. The evaporation chamber 142 is located inside the rigid support member 121 and overlaps with the heating element 11. The evaporation chamber 142 includes a second inlet 142a and a second outlet 142b.

In the embodiment, the evaporation channel 143 is used to transport the working fluid F that is converted from a liquid state heat absorption to a gas state. The evaporation channel 143 is located inside the rigid support member 121 and is connected between the first outlet 141b of the liquid storage chamber 141 and the second inlet 142a of the evaporation chamber 142.

In the embodiment, in the direction of the thickness of the display device 100, a cross-sectional shape of the evaporation channel 143 is rectangular or quasi rectangular to reduce the difficulty of manufacturing the evaporation channel 143. Among them, shapes of quasi rectangles and rectangles tend to be the same, for example, the quasi rectangles include chamfered rectangles.

It should be noted that in the thickness direction of the display device 100, when the cross-section of the evaporation channel 143 is rectangular or quasi rectangular, two sidewalls of the evaporation channel 143 are parallel, and a evaporation channel width d of the evaporation channel 143 is equal to a distance between the two sidewalls of the evaporation channel 143.

It can be understood that in the direction of the thickness of the display device 100, a cross-sectional shape of the evaporation channel 143 may be circular, elliptical, trapezoidal, or inverted trapezoidal.

In the embodiment, the anti-backflow channel 144 is a unidirectional channel used to cool the working fluid F from the gas state to the liquid state due to heat loss during the flow process, while allowing the working fluid F to flow in a single direction.

At least one anti-backflow channel 144 is located inside the rigid support member 121, and each anti-backflow channel 144 includes an anti-backflow inlet 144a and an anti-backflow outlet 144b. The anti-backflow inlet 144a of each anti-backflow channel 144 is connected to the second outlet 142b of the evaporation chamber 142, and the anti-backflow outlet 144b of each anti-backflow channel 144 is connected to the first inlet 141a of the liquid storage chamber 141.

In the embodiment, after the evaporation chamber 142 absorbs the heat emitted by the heating element 11, a temperature in the evaporation chamber 142 increases. After the temperature in the evaporation chamber 142 is higher than that in the liquid storage chamber 141, the hot air in the evaporation chamber 142 flows into the liquid storage chamber 141. A liquid working fluid F in the liquid storage chamber 141 absorbs heat and evaporates into a gaseous working fluid F, and the gaseous working fluid F flows into the evaporation chamber 142. Then, the gaseous working fluid F flows from the evaporation chamber 142 into at least one anti-backflow channel 144 and flows unidirectionally in the anti-backflow channel 144 along the direction of the arrow shown in (A) of FIG. 5. That is, flowing along the anti-backflow inlet 144a of the anti-backflow channel 144 points towards the anti-backflow outlet 144b, the gaseous working fluid F dissipates heat during the flow process in at least one anti-backflow channel 144 and the temperature decreases, resulting in the gaseous working fluid F finally condensing into the liquid working fluid F. The liquid working fluid F flows from the anti-backflow outlet 144b of the anti-backflow channel 144 into the storage chamber 141 through the first inlet 141a of the storage chamber 141.

In addition, due to the anti-backflow effect of the anti-backflow channel 144, it may improve the problem that the liquid working fluid F in the storage chamber 141 absorbs heat and evaporates into the gaseous working fluid F, causing the gaseous working fluid F to flow from the anti-backflow outlet 144b of the anti-backflow channel 144 to the anti-backflow inlet 144a, thereby forming a unidirectional heat dissipation circuit and improving circuit crosstalk during the heat dissipation process, greatly improving the heat dissipation efficiency of the working fluid F in the loop heat dissipation cavity 14.

In the embodiment, the loop heat dissipation cavity 14 further includes a vapor accommodating chamber 145 located inside the rigid support member 121 and connected between the evaporation chamber 142 and at least one anti-backflow inlet 144a, to buffer the working fluid F in the gaseous state. When the number of the anti-backflow inlets 144a is multiple, the working fluid F in the gaseous state may be better regulated to enter a plurality of anti-backflow inlets 144a.

In the embodiment, the vapor accommodating chamber 145 includes a third inlet 145a and at least one third outlet 145b. The third inlet 145a of the vapor accommodating chamber 145 is connected to the second outlet 142b of the evaporation chamber 142, and at least one third outlet 145b of the vapor accommodating chamber 145 is one-to-one connected to at least one anti-backflow inlet 144a of the anti-backflow channel 144. When the number of anti-backflow channels 144 is multiple, the number of the anti-backflow inlets 144a is also multiple, and the number of the third outlets 145b is also multiple.

In the embodiment, the loop heat dissipation cavity 14 further includes a condensation chamber 146 located inside the rigid support member 121. The condensation chamber 146 is connected between at least one anti-backflow outlet 144b of the anti-backflow channel 144 and the liquid storage chamber 141 to increase the space for the condensation of the gaseous working fluid F from the gaseous state to the liquid state.

In the embodiment, the condensation chamber 146 includes at least one fourth inlet 146a and a fourth outlet 146b, at least one fourth inlet 146a is connected one-on-one to at least one anti-backflow outlet 144b of the anti-backflow channel 144, and the fourth outlet 146b is connected to the first inlet 141a of the liquid storage chamber 141. When there are a plurality of the anti-backflow channels 144, there are also a plurality of anti-backflow outlets 144b and a plurality of fourth inlets 146a.

In the embodiment, along the thickness direction of the rigid support member 121, cross-sectional shapes of the liquid storage chamber 141, the evaporation chamber 142, the vapor accommodating chamber 145, and the condensation chamber 146 are rectangular or quasi rectangular to simplify the preparation process of the liquid storage chamber 141, the evaporation chamber 142, the vapor accommodating chamber 145, and the condensation chamber 146.

It can be understood that along the thickness direction of the rigid support member 121, the cross-sectional shapes of the liquid storage chamber 141, the evaporation chamber 142, the vapor accommodating chamber 145, and the condensation chamber 146 may be trapezoidal or other shapes.

In the embodiment, along a direction perpendicular to the thickness of the rigid support member 121, the cross-sectional shapes of the liquid storage chamber 141, the evaporation chamber 142, the vapor accommodating chamber 145, and the condensation chamber 146 may be rectangular or quasi rectangular to simplify the preparation process of the liquid storage chamber 141, the evaporation chamber 142, the vapor accommodating chamber 145, and the condensation chamber 146.

It can be understood that along the direction perpendicular to the thickness of the rigid support member 121, the cross-sectional shapes of the liquid storage chamber 141, the evaporation chamber 142, the vapor accommodating chamber 145, and the condensation chamber 146 may be circular, pentagon, hexagon, or diamond in shape.

In the embodiment, the liquid storage chamber 141, the evaporation chamber 142, the vapor accommodating chamber 145, and the condensation chamber 146 are located at four corners of a virtual rectangle, respectively. The liquid storage chamber 141 and the evaporation chamber 142 are located at two adjacent corners, respectively. The evaporation chamber 142 and the vapor accommodating chamber 145 are located at two adjacent corners, respectively. The vapor accommodating chamber 145 and the condensation chamber 146 are located at two adjacent corners, respectively, The condensation chamber 146 and the liquid storage chamber 141 are located at two adjacent corners, to make an outer contour same or similar in shape to the part of the non-folding area NFA corresponding to the rigid support member 121, and the outer contour is defined by an arrangement of the liquid storage chamber 141, the evaporation chamber 142, the vapor accommodating chamber 145, and the condensation chamber 146, in order to maximize the utilization of the space of the rigid support member 121 corresponding to the non-folding area NFA and better achieve heat dissipation.

In the embodiment, a distance between the liquid storage chamber 141 and the evaporation chamber 142 is smaller than a distance between the vapor accommodating chamber 145 and the condensation chamber 146, which is more conducive to making a length of the evaporation channel 143 shorter, and a length of each anti-backflow channel 144 longer. The working fluid F has a longer path to convert from gas to liquid and a longer condensation time in the anti-backflow channel 144, and the working fluid F may convert from liquid to gas more quickly.

In the embodiment, at least one anti-backflow channel 144 is connected between the vapor accommodating chamber 145 and the condensation chamber 146, and the evaporation channel 143 is connected between the liquid storage chamber 141 and the evaporation chamber 142, which is beneficial for a length of each evaporation channel 143 to be smaller than that of each anti-backflow channel 144.

In the embodiment, an extension direction of the evaporation channel 143 is the same as that of at least one anti backflow channel 144, and an isolation part 18 is disposed between the evaporation channel 143 and at least one anti-backflow channel 144 to avoid interference from the heat of the evaporation channel 143 on the process of condensing the working fluid F of the gas in at least one anti-backflow channel 144 into a liquid.

In the embodiment, the isolation part 18 is a solid part of the support body 1211 to simplify the preparation process of the rigid support member 121.

It can be understood that in other embodiments, the solid part of the isolation part 18 may include cavities or grooves to better avoid interference from the heat of the evaporation channel 143 on the process of condensing the working fluid F of the gas in at least one anti-backflow channel 144 into a liquid.

In the embodiment, the length of each evaporation channel 143 is smaller than the length of each anti backflow channel 144, in order to make the path for the working fluid F to convert from gas to liquid longer and thus more fully dissipate heat.

In the embodiment, a plurality of anti-backflow channels 144 extend along a first direction x, the plurality of anti-backflow channels are disposed side by side and spaced in a second direction y, and the first direction x intersects with the second direction y.

Specifically, the first direction x is perpendicular to the second direction y, and it can be understood that an angle between the first direction x and the second direction y may be an obtuse or acute angle.

It should be noted that the more anti backflow channels 144, the more paths for the working fluid F to convert from gas to liquid, which is more conducive to improving the heat dissipation efficiency of the working fluid F.

In the embodiment, when the display device 100 is a foldable display device, when the display device 100 is in an unfolded state, a direction of the folding area FA pointing toward the non-folding area NFA is the second direction y or the first direction x.

Specifically, when the display device 100 is a foldable display device, when the display device 100 is in an unfolded state, the direction of the folding area FA pointing toward the non-folding area NFA is the second direction y.

In the embodiment, a size of a part of the rigid support member 121 corresponding to each non-folding area NFA in the first direction x is larger than a size of a part of the rigid support member 121 corresponding to each non-folding area NFA in the second direction y, which is beneficial for the length of each anti-backflow channel 144 to be longer.

In the embodiment, referring to FIGS. 5 and 6, each anti-backflow channel 144 includes a main flow channel 1441 and at least one anti-backflow sub-channel 1442. Each main flow channel 1441 is a hollow main flow channel structure, and is connected between the anti-backflow inlet 144a and the anti-backflow outlet 144b. Each anti-backflow sub-channel 1442 is also a hollow channel structure, at least one anti-backflow sub-channel 1442 is located on at least one side of the main flow channel 1441 in a direction of intersection with an extension direction of the main flow channel 1441 and is connected to the main flow channel 1441. Each anti-backflow sub-channel 1442 extends toward a direction close to the anti-backflow inlet 144a.

It should be noted that each anti-backflow sub-channel 1442 extends towards the direction close to the anti-backflow inlet 144a, resulting in an angle of less than 90 degrees between the outlet extension direction of the anti-backflow sub-channel 1442 and the extension direction of the main flow channel 1441, which enables the working fluid F to have unidirectional flow characteristics in the anti-backflow channel 144. The anti-backflow channel 144 has the function of preventing internal airflow reverse crosstalk and ensuring efficient and forward operation of the heat dissipation circuit.

In the embodiment, in the thickness direction of the display device 100, the cross-sectional shapes of the main flow channel 1441 and the anti-backflow sub-channel 1442 are both rectangular or quasi rectangular, to reduce the difficulty of manufacturing the mains flow channel 1441 and the anti-backflow sub-channel 1442.

It can be understood that in the thickness direction of the display device 100, the cross-sectional shapes of the main flow channel 1441 and the anti-backflow sub-channel 1442 may be circular, elliptical, trapezoidal, or inverted trapezoidal.

In the embodiment, the rigid support member 121 further includes at least one partition part 19, which is located on at least one side of the main flow channel 1441 in the direction intersecting with the extension direction of the main flow channel 1441. Each partition part 19 is adjacent to one anti-backflow sub-channel 1442, and each anti-backflow sub-channel 1442 surrounds a part of the partition part 19, The partition part 19 limits the anti-backflow sub-channel 1442 to a path of circuitous type and is connected to the main flow channel 1441.

The partition part 19 extends in a direction close to the anti-backflow inlet 144a, and the extension direction of the partition part 19 is parallel to the extension direction of the anti-backflow channel 144. The partition part 19 is a solid part of the support body 1211.

In the embodiment, in the thickness direction perpendicular to the display device 100, the cross-sectional shape of the partition part 19 is parallelogram to simplify the manufacturing process of the anti-backflow sub-channel 1442. In the thickness direction of the display device 100, the cross-sectional shape of the partition part 19 is rectangular.

In the embodiment, each main flow channel 1441 extends in a straight line along the first direction x to simplify the processing process of the main flow channel 1441. It can be understood that each main flow channel 1441 may extend in curves or broken lines.

A plurality of the anti-backflow sub-channels 1442 are symmetrically connected on opposite sides of each main flow channel 1441 in the second direction y perpendicular to the first direction x, with equal spacing between two adjacent anti-backflow sub-channels 1442 on the same side to improve the anti-backflow ability of each anti backflow channel 144 and increase a volume of each anti-backflow channel 144, thereby increasing the heat dissipation path of the working fluid F in each anti-backflow channel 144.

The working principle of the anti-backflow channel 144 is as shown in (A) of FIG. 5, when the working fluid F flows in the forward direction of the arrow, the working fluid F mainly flows along the main flow channel 1441. The component in the first direction x of the flow direction of the working fluid F flowing out of the anti-backflow sub-channel 1442 is the same as the flow direction of the working fluid F flowing in the main flow channel 1441, that is, the working fluid F in the anti-backflow sub-channel 1442 and the working fluid F flowing in the main flow channel 1441 converge in the same direction, forming a positive pressure drop. It is easy to quickly and evenly disperse the working fluid F with hot gas flow inside the anti-backflow channel 144. The working fluid F with hot gas flow quickly cools down due to contact with a large area of the low temperature anti backflow channel 144, and finally converges to the condensation chamber 146 below, playing a role in rapid heat dissipation. As shown in (B) of FIG. 5, when the working fluid F flows in the opposite direction along the arrow, while flowing along the structure of the main flow channel 1441, under the guidance of the isolation part 19, causing the component in the first direction x of the flow direction of the working fluid F flowing out of the anti-backflow sub-channel 1442 to be opposite to the flow direction of the working fluid F flowing in the main flow channel 1441. That is, the working fluid F of the anti-backflow sub-channel 1442 and the working fluid F flowing in the main channel 1441 converge in the opposite direction. The flow of the working fluid F of the anti-backflow sub-channel 1442 hinders the flow of the working fluid F flowing in the main channel 1441. Under the reverse crosstalk of a plurality of anti-backflow sub-channels 1442, the working fluid F of the main channel 1441 is basically blocked one by one, resulting in no flow. Therefore, the working fluid F forms a unidirectional conduction effect in the anti-backflow channel 144.

In this embodiment, referring to FIG. 6, in the thickness direction of the display device 100, when the cross-sectional shapes of the main flow channel 1441 and the anti-backflow sub-channel 1442 are both rectangular or quasi rectangular, the anti-backflow sub-channel width a of the anti-backflow sub-channel 1442 is smaller than the main flow channel width b of the main flow channel 1441, so that the working fluid F may mainly flows along the main flow channel 1441, and the anti-backflow sub-channel 1442 may play a role in preventing backflow.

It should be noted that when the cross-sectional shapes of the main flow channel 1441 and the anti-backflow sub-channel 1442 are both rectangular or quasi rectangular, two sidewalls of the anti-backflow sub-channel 1442 are parallel, and two sidewalls of the main flow channel 1441 are also parallel. The anti-backflow sub-channel width a of the anti-backflow sub-channel 1442 is equal to a distance between the two sidewalls of the anti-backflow sub-channel 1442, The main flow channel width b of the main flow channel 1441 is equal to a distance between the two sidewalls of the main flow channel 1441.

A ratio of the anti-backflow sub-channel width a of the anti-backflow sub-channel 1442 to the main flow channel width b of the main flow channel 1441 is greater than or equal to 0.1 and less than or equal to 0.9, further enabling the working fluid F to flow mainly along the main flow channel 1441, while the anti-backflow sub-channel 1442 may play a role in preventing reverse flow.

For example, the ratio of the anti-backflow sub-channel width a of the anti-backflow sub-channel 1442 to the main flow channel width b of the main flow channel 1441 may be greater than or equal to 0.2 and less than or equal to 0.8, or the ratio of the anti-backflow sub-channel width a of the anti-backflow sub-channel 1442 to the main flow channel width b of the main flow channel 1441 may be greater than or equal to 0.3 and less than or equal to 0.7, or, The ratio of the anti-backflow sub-channel width a of the anti-backflow sub-channel 1442 to the main flow channel width b of the main flow channel 1441 may be greater than or equal to 0.4 and less than or equal to 0.6.

In the embodiment, in the thickness direction of the display device 100, when both the cross-section of the main flow channel 1441 and the cross-section of the evaporation channel 143 are rectangular or quasi rectangular, the main flow channel width b of each main flow channel 1441 is smaller than the evaporation channel width d of each evaporation channel 143, which is beneficial for the gaseous working fluid F generated in the storage chamber 141 to enter the larger evaporation channel 143 more easily, further improving the problem of back flow of the working fluid F in the loop heat dissipation cavity 14.

The main flow channel width b of the main flow channel 1441 is greater than or equal to 30 microns and less than or equal to 50 microns, to ensure that the main flow channel 1441 has a suitable size and that the gaseous working fluid F may have sufficient space for condensation in the main flow channel 1441.

For example, the main flow channel width b of the main flow channel 1441 may be 30 microns, 32 microns, 35 microns, 38 microns, 40 microns, 42 microns, 45 microns, or 50 microns.

In the embodiment, referring to FIG. 5, an angle β between a straight line L2 where the extension direction of each anti-backflow sub-channel 1442 is located and a straight line L1 where the extension direction of the main flow channel 1441 is located is greater than or equal to 20 degrees and less than or equal to 35 degrees, to ensure the anti-backflow effect of each anti-backflow sub-channel 1442, while also ensuring that the working fluid F in the gaseous state may have a longer detour path in each anti backflow sub-channel 1442, which may more fully dissipate heat and change from a gaseous state to a liquid state.

For example, the angle β between the straight line L2 where the extension direction of each anti backflow sub-channel 1442 is located and the straight line L1 where the extension direction of the main flow channel 1441 is located may be 20 degrees, 25 degrees, 30 degrees, or 35 degrees.

In the embodiment, in the thickness direction of the display device 100, the height of each anti backflow sub-channel 1442, the height of the main flow channel 1441, the height of the liquid storage chamber 141, the height of the evaporation chamber 142, the height of the vapor accommodating chamber 145, and the height of the condensation chamber 146 are equal.

In the embodiment, referring to FIG. 6, each anti-backflow sub-channel 1442 includes an inlet sub-channel 1442a and an outlet sub-channel 1442b. The inlet sub-channel 1442a and the outlet sub-channel 1442b are located on opposite sides of the partition part 19. The inlet sub-channel 1442a is disposed close to the anti-backflow inlet 144a, and the outlet sub-channel 1442b is disposed close to the anti-backflow outlet 144b. The inlet sub-channel 1442a and the outlet sub-channel 1442b both extend toward a direction close to the anti-backflow inlet 144a to further improve the anti-backflow ability of each anti backflow sub-channel 1442.

In the embodiment, each anti-backflow sub-channel 1442 further includes an intermediate channel 1442c, which is connected between the inlet sub-channel 1442a and the outlet sub-channel 1442b. The intermediate channel 1442c is located on a side of the partition part 19 away from the main flow channel 1441 to further increase the space of each anti-backflow sub-channel 1442 and improve the heat dissipation effect of the gaseous working fluid F flowing through the anti-backflow sub-channel 1442.

In the embodiment, an extension direction of the intermediate channel 1442c is the same as that of the main flow channel 1441, to simplify the processing process of the intermediate channel 1442c and ensure that the working fluid F may smoothly flow from the inlet sub-channel 1442a to the outlet sub-channel 1442b.

In the embodiment, in the case where the intermediate channel 1442c is connected between the inlet sub-channel 1442a and the outlet sub-channel 1442b, the inlet sub-channel 1442a is parallel to the outlet sub-channel 1442b, to simplify the processing of the inlet sub-channel 1442a and the outlet sub-channel 1442b, thereby simplifying the processing of the anti-backflow channel 144.

In the thickness direction of the display device 100, the section of the inlet sub-channel 1442a, the section of the outlet sub-channel 1442b, and the section of the intermediate channel 1442c are all rectangular or quasi rectangular. An inlet sub-channel width of the inlet sub-channel 1442a, an outlet sub-channel width of the outlet sub-channel 1442b, and an intermediate channel width of the intermediate channel 1442c are all equal to the anti-backflow sub-channel width a of the anti-backflow sub-channel 1442.

In the embodiment, in the case where the intermediate channel 1442c is connected between the inlet sub-channel 1442a and the outlet sub-channel 1442b, a sum c of the inlet sub-channel width of the inlet sub-channel 1442a, the outlet sub-channel width of the outlet sub-channel 1442b, and a distance between the inlet sub-channel 1442a and the outlet sub-channel 1442b is greater than or equal to the mains flow channel width b of the main channel 1441, so that the sum c of the inlet sub-channel width of the inlet sub-channel 1442a, the outlet sub-channel width of the outlet sub-channel 1442b and the distance between the inlet sub-channel 1442a and the outlet sub-channel 1442b is relatively large, and the inlet sub-channel 1442a, the outlet sub-channel 1442b, and the partition 19 may be provided with larger layout space, which is more conducive to reducing the processing difficulty of the inlet sub-channel 1442a and the outlet sub-channel 1442b.

Specifically, a ration of the sum c of the inlet sub-channel width of the inlet sub-channel 1442a, the outlet sub-channel width of the outlet sub-channel 1442b, and a distance between the inlet sub-channel 1442a and the outlet sub-channel 1442b, to the main flow channel width b of the main flow channel 1441 is greater than or equal to 1 and less than or equal to 1.2.

In the embodiment, the display module 200 further includes a polarizer 20, an ultra-thin glass 21, and a protective window 22.

In the embodiment, the polarizer 20 is bonded to a light-emitting surface 10a of the display panel 10 through a fourth adhesive layer 154.

In the embodiment, the ultra-thin glass 21 is located on a side of the polarizer 20 away from the display panel 10, and he ultra-thin glass 21 is bonded to the polarizer 20 through a fifth adhesive layer 155.

In the embodiment, the protective window 22 is located on a side of the ultra-thin glass 21 away from the display panel 10, and is bonded to the ultra-thin glass 21 through a sixth adhesive layer 156.

The description about the foregoing embodiments is merely provided to help understand the method and core ideas of the present disclosure. Persons of ordinary skill in the art should understand that they may still make modifications to the technical solutions described in the foregoing embodiments or make equivalent replacements to some technical features thereof, without departing from the scope of the technical solutions of the embodiments of the present disclosure.

What is claimed is:

1. A display device, comprising:
    a display panel;
    a heating element located on a back side of a light-emitting surface of the display panel; and
    a support component located on the back side of the light-emitting surface of the display panel, wherein the support component comprises:
    a loop heat dissipation cavity located inside the support component, wherein a part of the loop heat dissipation cavity overlaps the heating element, and the loop heat dissipation cavity comprises at least one anti-backflow channel; and
    a working fluid located in the loop heat dissipation cavity,
    wherein each of the at least one anti-backflow channel anti-backflow channel comprises an anti-backflow inlet and an anti-backflow outlet, and further comprises:
    a main flow channel connected between the anti-backflow inlet and the anti-backflow outlet; and
    two or more anti-backflow sub-channels symmetrically distributed on opposite sides of the main flow channel in a direction intersecting an extending direction of the main flow channel, wherein the two or more anti-backflow sub-channels communicate with the main flow channel.

2. The display device of claim 1, wherein the loop heat dissipation cavity comprises:
    a liquid storage chamber comprising a first inlet and a first outlet;
    an evaporation chamber overlapping the heating element and comprising a second inlet and a second outlet; and
    an evaporation channel connected between the first outlet of the liquid storage chamber and the second inlet of the evaporation chamber;
    wherein the anti-backflow inlet is connected with the second outlet of the evaporation chamber, and the anti-backflow outlet is connected with the first inlet of the liquid storage chamber.

3. The display device of claim 2, wherein the at least one anti-backflow channel comprises.

4. The display device of claim 2, wherein two or more anti-backflow sub-channels extends towards a direction close to the anti-backflow inlet.

5. The display device of claim 4, wherein the support component further comprises at least one partition part located on at least one side of the main flow channel in the direction intersecting the extending direction of the main flow channel, each of the at least one partition part is disposed adjacent to one of the two or more anti-backflow sub-channels, and each of the two or more anti-backflow sub-channels surrounds a part of one of the at least one partition part.

6. The display device of claim 5, wherein each of the two or more anti-backflow sub-channels comprises:
    an inlet sub-channel disposed close to the anti-backflow inlet; and
    an outlet sub-channel disposed close to the anti-backflow outlet;
    wherein the inlet sub-channel and the outlet sub-channel are respectively located on two sides of the one of the at least one partition part, and the inlet sub-channel and the outlet sub-channel extend towards to the anti-backflow inlet.

7. The display device of claim 6, wherein the inlet sub-channel and the outlet sub-channel are disposed in parallel.

8. The display device of claim 6, wherein each of the two or more anti-backflow sub-channels further comprises an intermediate channel connected between the inlet sub-channel and the outlet sub-channel, and the intermediate channel is located on a side of the one of the at least one partition part away from the main flow channel.

9. The display device of claim 6, wherein cross-sections of the inlet sub-channel, the outlet sub-channel and the main flow channel in a thickness direction of the display device are rectangular or almost rectangular, and a sum of an inlet sub-channel width of the inlet sub-channel, an outlet sub-channel width of the outlet sub-channel and a distance between the inlet sub-channel and the outlet sub-channel is greater than or equal to a main flow channel width of the main flow channel.

10. The display device of claim 4, wherein cross-sections of the two or more anti-backflow sub-channels and the main flow channel in a thickness direction of the display device are rectangular or almost rectangular, and an anti-backflow sub-channel width of each of the two or more anti-backflow sub-channels is smaller than a main flow channel width of the main flow channel.

11. The display device of claim 4, wherein an included angle between a straight line where an extending direction of each of the two or more anti-backflow sub-channels is located and a straight line where the extending direction of the main flow channel is located ranges from 20 degrees to 35 degrees.

12. The display device of claim 4, wherein cross-sections of the main flow channel and the evaporation channel in a thickness direction of the display device are rectangular or almost rectangular, and a main flow channel width of each the main flow channel is smaller than an evaporation channel width of the evaporation channel.

13. The display device of claim 2, wherein an extending direction of the evaporation channel and an extending direction of the at least one anti-backflow channel are the same, and the support component further comprises an isolation part disposed between the evaporation channel and the at least one anti-backflow channel.

14. The display device of claim 2, wherein the loop heat dissipation cavity comprises a vapor accommodating chamber comprising a third inlet and at least one third outlet, the third inlet of the vapor accommodating chamber is connected with the second outlet of the evaporation chamber, and the at least one third outlet of the vapor accommodating chamber is connected one-to-one with the anti-backflow inlet of the at least one anti-backflow channel.

15. The display device of claim 2, wherein the loop heat dissipation cavity further comprises a condensation chamber comprising at least one fourth inlet and one fourth outlet, the at least one fourth inlet is connected one-to-one with the anti-backflow outlet of the at least one anti-backflow channel, and the fourth outlet is connected with the first inlet of the liquid storage chamber.

16. The display device of claim 1, wherein the at least one anti-backflow channel comprises a plurality of anti-backflow channels, and the plurality of the anti-backflow channels extend along a first direction and, are disposed side by side and at intervals along a second direction, and the first direction intersects the second direction.

17. The display device of claim 1, wherein the support component comprises:
a support body provided with a loop heat dissipation groove; and
a cover plate covering and sealing the loop heat dissipation groove, wherein the loop heat dissipation cavity is defined by an inside wall of the loop heat dissipation groove and a surface of the cover plate covering the loop heat dissipation groove.

18. The display device of claim 17, wherein the support body further comprises an installation groove, the installation groove is located on at least one side of the loop heat dissipation groove in a thickness direction of the support body, the installation groove covers and communicates with the loop heat dissipation groove, and the cover plate is installed in the installation groove.

19. The display device of claim 17, wherein a depth of the loop heat dissipation groove is smaller than a thickness of the support body, and the loop heat dissipation groove is located on a surface of the support body away from the display panel.

20. The display device of claim 19, wherein the display device further comprises a thermal pad located between the cover plate and the heating element, and the thermal pad is in contact with the heating element and the cover plate;
or the cover plate is in contact with the heating element.

* * * * *